(12) United States Patent
Shaw et al.

(10) Patent No.: US 6,225,178 B1
(45) Date of Patent: May 1, 2001

(54) RADIATION HARDENED FIELD OXIDE FOR VLSI SUB-MICRON MOS DEVICE

(75) Inventors: Gordon A. Shaw; Curtis H. Rahn, both of Plymouth; Cheisan Yue, Roseville; Todd A. Randazzo, Savage, all of MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 07/466,709

(22) Filed: Jan. 2, 1990

(51) Int. Cl.[7] .................. H01L 21/336; H01L 21/338
(52) U.S. Cl. ....................... 438/308; 438/59; 438/167
(58) Field of Search .................................. 437/19, 31, 42, 437/62, 50; 428/408; 438/59, 167, 308

(56) References Cited

U.S. PATENT DOCUMENTS

| | | | |
|---|---|---|---|
| 4,214,918 | * 7/1980 | Gat et al. | 437/19 |
| 4,268,951 | * 5/1981 | Elliott et al. | 437/42 |
| 4,489,104 | * 12/1984 | Lee | 427/96 X |
| 4,541,167 | 9/1985 | Havemann et al. | 29/576 W |
| 4,601,779 | * 7/1986 | Abernathey et al. | 156/633 X |
| 4,707,897 | * 11/1987 | Rohrer et al. | 29/25.42 |
| 4,717,681 | * 1/1988 | Curran | 437/31 |

OTHER PUBLICATIONS

Ionizing Radiation Effects in MOS Devices Circuits, edited by T. P. Ma and Paul V. Dresendorf.

* cited by examiner

Primary Examiner—Peter A. Nelson
(74) Attorney, Agent, or Firm—Kris T. Fredrick

(57) ABSTRACT

A process for oxidizing the silicon layer into a device-isolating field oxide having a radiation-hardened reduced bird's beak. An angled and rotated field implant prior to oxidation is used to increase the doping concentration in the edge region of the MOS transistors to compensate for boron leaching during oxidation. The field oxide is grown at a low temperature by high pressure oxidation which increases total dose hardness by making a silicon-rich oxide film.

15 Claims, 4 Drawing Sheets

RADIATION HARDENED FIELD OXIDE FOR VLSI SUB-MICRON MOS DEVICE

FIELD OF INVENTION

The present invention pertains to integrated circuit technology and particularly to radiation-hardened very-large-scale integrated (VLSI) circuit technology. More particularly, the invention pertains to metal oxide semiconductor (MOS) circuitry.

BACKGROUND OF THE INVENTION

The related art technology, radiation-insensitive complementary metal oxide semiconductor (RICMOS), involves radiation hardened field oxide which results in poor topography making it impractical for adequate submicron line patterning needed for state-of-the-art VLSI technology.

The part of an MOS structure Most sensitive to ionizing radiation is the oxide insulating layer. When the radiation passes through the oxide, the energy deposited creates electron/hole pairs. The radiation-generated electrons are more mobile than the holes and are swept out of the oxide in about a picosecond. During the moment, a fraction of the electrons and holes recombine. The amount of recombination depends on the applied field and the kind and energy of the incident particle. The holes that escape the initial recombination are relatively immobile and remain near their point of generation, thereby causing negative voltage shifts in the electrical characteristics of the MOS device. But over a longer period of time, exceeding one second, the holes undergo a rather anomalous stochastic hopping transport through the oxide in response to any electric fields present. This hole transport process gives rise to a short-term, transient recovery in the voltage shift. When the holes reach the $SiO_2$ interface (for positive gate bias), some of them are captured in long-term trapping sites, and cause a remnant negative voltage shift that is not sensitive to the silicon surface potential, which can last from hours to years. This long-term radiation-induced voltage shift is a common form of radiation damage in MOS devices. The long-term trapping of holes (i.e., a net positive charge in the oxide layer) near the interface, as well as subsequent anealing of them, is sensitive to the processing of the oxide and to field and temperature. This effect generally dominates other radiation damage processes in MOS structures.

Much effort in the related art has been directed toward reducing and controlling oxide positive charge trapping. Early radiation-insensitive MOS circuits had ionic contaminants in the gate oxide materials to alter and improve the oxide properties under radiation. Later on, MOS device fabrication techniques and process controls in the related art improved, and thus the hardening techniques that relied on impurity addition to the oxide fell out of favor (at least for gate oxide). Radiation hardening then concentrated on the primary source of the radiation-generated oxide positive charge (i.e., the trapped hole). A hole trap designates normally neutral oxide defects that can capture holes and retain then for long periods of time.

Radiation-induced generation and trapping of holes is a problem in both gate oxide and field or silicon oxide of MOS devices. Field oxides are typically about an order of magnitude thicker than gate oxides. The properties of field oxides are not as well controlled as those of gate oxides. In the related art, field oxides may be produced by processes such as chemical vapor deposition (CVD), not used for gate oxides. Threshold voltage changes due to radiation are proportional to the square of the oxide thickness. For instances a relatively small radiation dose causes a significant change in threshold voltage in a parasitic field oxide field effect transistor (FET). Greater oxide thickness also results in smaller electric fields in the oxides. Smaller fields reduce charge yield and enhance both hole capture and electron/hole recombination at the hole traps. Greater oxide thickness also increases the charge-generation volume and the distance that both holes and electrons must travel to escape the oxide, which in turn enhances trapping and recombination. The net result is that space and recombination effects begin to dominate the voltage threshold change of field oxides at doses of a few Krad ($SiO_2$), two or three orders of magnitude below the levels of radiation that typically cause such effects in the thinner gate oxides. Both the increase in oxide thickness and the decrease in the oxide field also greatly increase the time scale of hole transport through the oxide. Hence, substantial hole transport may take place in a field oxide for thousands of seconds after being subject to radiation.

In clean, thermally grown oxides on silicon, the long-term charge trapping responsible for the voltage threshold change is dominated by the trapping of holes.

The effect of radiation on field oxide isolation usually in MOS transistor structures is of concern here. A thick oxide is used to electrically isolate transistors from one another and to terminate the active channel within a given transistor and thus define the channel width. In a radiation environment, the field oxide traps have sore charge than the gate oxide. For oxide isolation over p-type substrates (i.e. for n-channel isolation), the threshold voltage under thick oxide regions can be reduced significantly by radiation to the extent of dropping below zero volts. Then isolation becomes ineffective and leakage currents increase. One leakage current path may be an "end-around" leakage between the source and the drain of a transistor. Another leakage current path may be between the n-channel source and the n-substrate (in bulk p-well CMOS technology; but in an n-well technology the leakage path would between the n-channel source and the n-well).

The maintenance of isolation between adjacent devices and between the source and drain of n-channel transistors is a major factor in the design of radiation-hardened circuits. When subject to radiations the field oxide tends to have a large buildup of trapped holes that can lead to an inversion of the surface over p-type regions. Large threshold voltage shifts are possible and tend to be proportional to oxide thicknesses. The buildup of trapped holes leads to a degradation of isolation between and within n-channel devices, and can cause circuit failure at relatively low radiation levels (1–5 krads).

Various approaches have been attempted to remove the detrimental effects of radiation on oxides of the transistors. A channel stop or guardband has been used to provide isolation between adjacent devices. However, the threshold voltage of this region is usually not sufficient to prevent inversion in a radiation environment, and the design does not provide sufficient protection against radiation-induced leakage between the source and the drain within an n-channel transistor. Guardbands require additional process steps and additional space in layout for a radiation-hardened circuit.

Another approach uses polysilicon only as a gate electrode which results in greatly reduced packing density oxide since the polysilicon cannot be effectively used as an interconnect layer. The use of polysilicon field shield is not necessarily fully effective in an ionizing radiation environment to prevent source-to-drain leakage.

One other approach utilizes closed gate structures such as closed complementary logic ($C^2L$). There is no leakage path between the source and drain with the $C^2L$ layout. However, such structure is very inefficient in its use of silicon area, particularly for multiple-input gates.

Still another approach attempts to maintain isolation in a radiation environment by altering the processing to produce a radiation-hardened field oxide. This approach adds significant process complexity.

Various tradeoffs by the various approaches noted above have pointed to an approach using a thin field oxide between the source and the drain and a thick field oxide elsewhere to isolate the transistor from rest of the circuit. This layout is combined with an epitaxial substrate.

SUMMARY OF THE INVENTION

The present invention is a version of the hardened reduced bird's beak (HRBB) process based on manufacturable, thermal oxidation processes. The invention involves completely oxidizing the silicon layer between transistors to maintain a fully isolated structure. A multi-directional, angled field implant prior to oxidation is used to raise the doping concentration in the edge region of the MOS transistors to compensate for the boron leaching during oxidation. The field oxide is grown at a low temperature by high pressure oxidation (HIPOX) which significantly increases total dose hardness by creating a silicon-rich oxide film. Edge current leakage of the resultant structure is less than the measurement resolution of a picoampere for a significant level of radiation.

DESCRIPTION OF THE PREFERRED EMBODIMENT

Figure 1A:
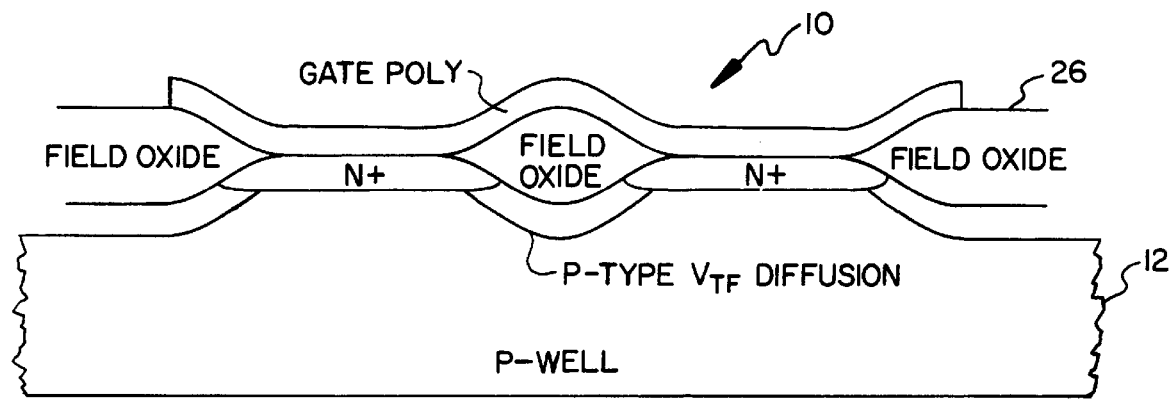
FIGS. 1a–b reveal the inter-device arrangement utilizing field oxide.
Figure 1B:
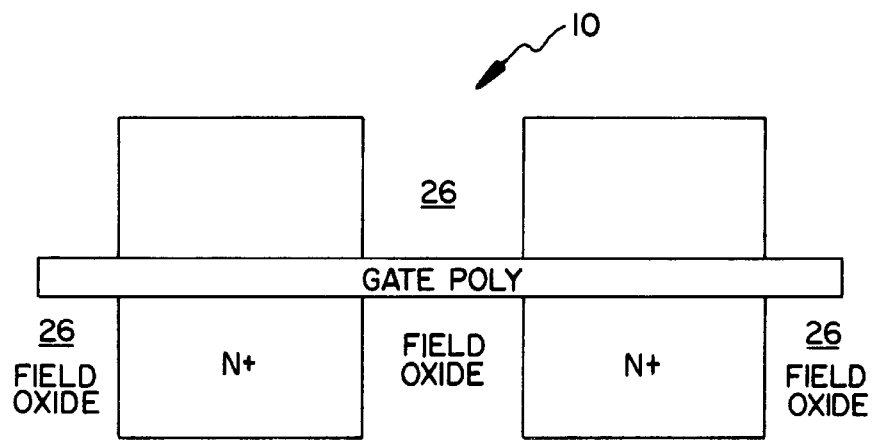

FIG. 1a is a cross-sectional view of inter-device arrangement 10 utilizing field oxide 26 for bulk hardness which reduces inter-device leakage caused by impinging radiation upon the device. FIG. 1b is a top view of arrangement 10 with field oxide 26.

Figure 2A:
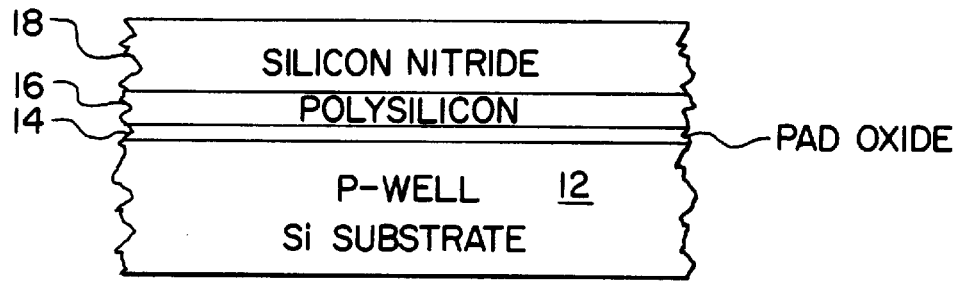
FIGS. 2a–g show the steps of the present invention.
Figure 2B:
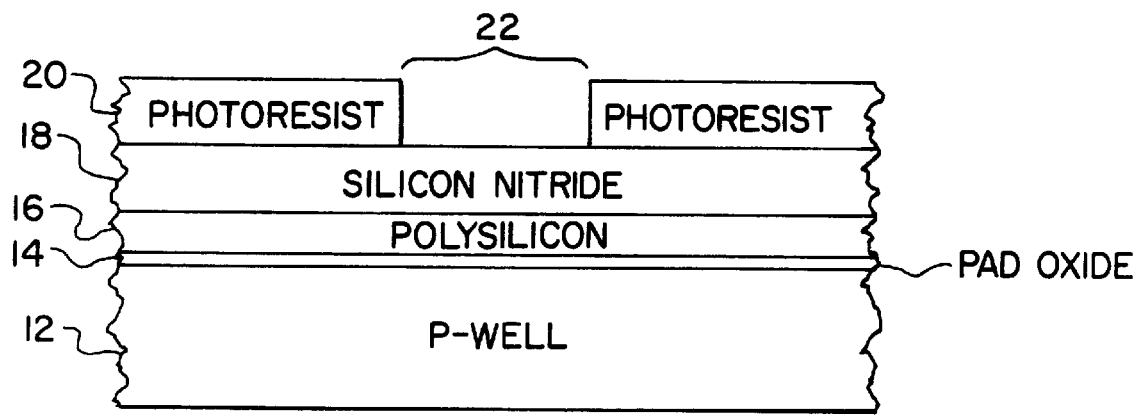
Figure 2C:
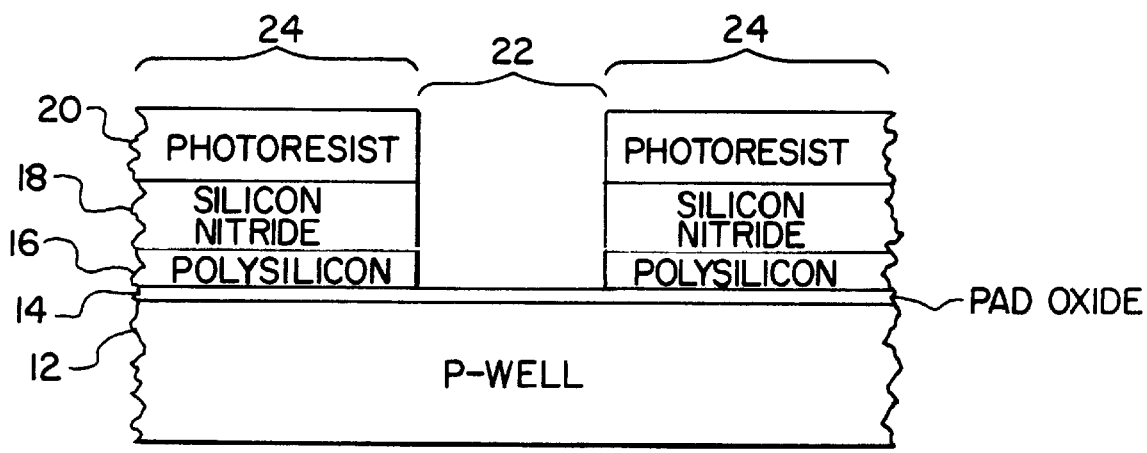

The method and resulting structure of present invention for the isolation formation begins with a stack of the materials similar to that used in the cited-art RICMOS devices. In FIG. 2a, P-well or silicon (S1) substrate 12 has a pad oxidation 14 applied resulting in a thin thermal oxide of layer from 50 to 150 angstroms. Polysilicon (polycrystalline silicon) layer 16 is deposited on pad oxide 14. The thickness of polysilicon layer 16 ranges from 400 to 600 angstroms. Silicon nitride 18 is deposited on polysilicon layer 16 at a thickness from 2000 to 3000 angstroms. Then photoresist 20 having a pattern, as shown in FIG. 2b, is applied to the surface of silicon nitride layer 18. Openings like that of opening 22 in photoresist 20 become isolation regions between devices and are areas of field oxide. Covered areas 24 become the active (device) regions. The field cut of silicon nitride 18 at opening 22 is accomplished with a standard photolithographic process. Through opening 22, silicon nitride 18 and polysilicon 16 are etched with an anisotropic reactive ion etch (RIE), i.e., a dry etch progress that transfers photoresist pattern opening 22 to the wafer with a vertical profile as shown in FIG. 2c. Pad oxide 14 is not etched during this etching process. Field cut photoresist material 20 is removed by a standard sulfuric peroxide $H_2SO_4/H_2O_2$ solution. There is a field oxide threshold-voltage-adjust ($V_{TF}$) cut that covers an N-well in a CMOS process.

Figure 2D:
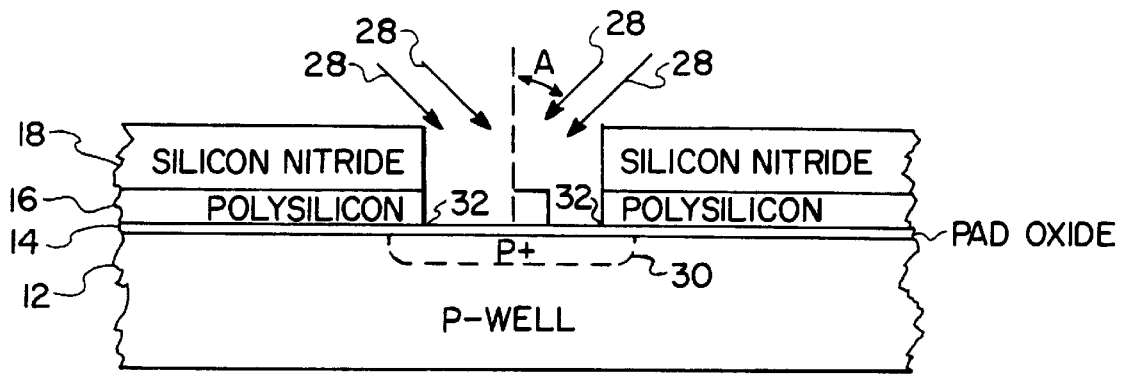

A boron $V_{TF}$ implant 28 is projected into opening 22 where field oxide 26 is to be grown. Boron implant 28 is projected at large angle A as shown in FIG. 2d. High tilt angle A is needed to project the P-type dopant 30 underneath the silicon nitride/polysilicon mask edge 32 to increase final field edge radiation hardness. Implant 28 is to prevent N-channel device-off leakage increase from increased total dose radiation due to inversion of silicon under the field edge. Four-way rotation of the direction of boron implant 28 is necessary because of the shadowing caused by high tilt angle A.

The $V_{TF}$ cut photoresist is removed by use of the standard $H_2SO_4/H_2O_2$ solution. The device at this stage 1s annealed in nitrogen at a temperature equal to or greater than 850 degrees Centigrade for twenty or more minutes to remove implant damage prior to field oxidation.

Figure 2E:
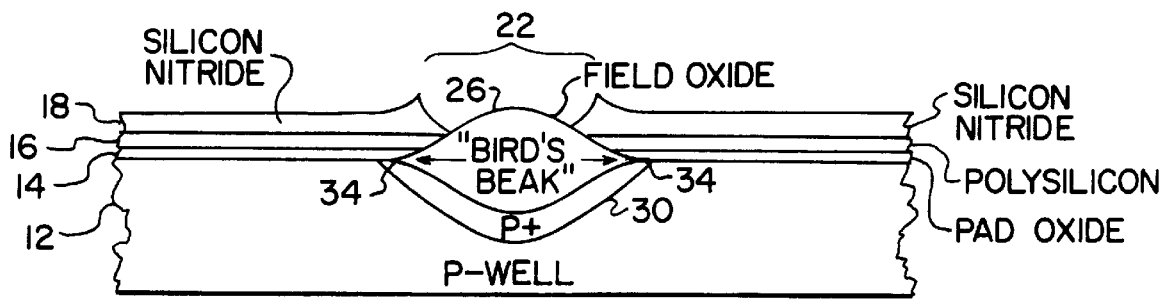

FIG. 2e shows the result of field oxidation at opening 22. Field oxide 26 is developed with wet $O_2$ ("steam") oxidation at about 800 to 900 degrees Centigrade in a high pressure (5 to 10 atmospheres) environment to increase the oxide growth rate. Field oxide 26 encroaches beneath edge 32 of silicon nitride 18 and polysilicon 16 and forms "bird beak" 34.

Figure 2F:
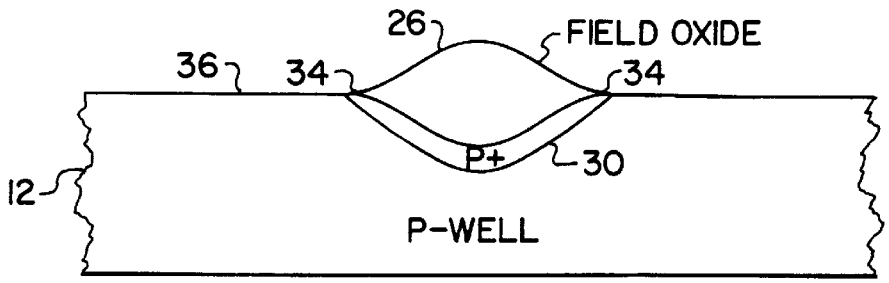

FIG. 2f reveals the removal of silicon nitride 18, polysilicon 16 and pad oxide 14 with standard wet-chemical techniques. Hot phosphoric acid ($H_3PO_4$) is used to remove silicon nitride 18 and potassium hydroxide (KOH) is used to remove polysilicon 16. Dilute hydrofluoric acid (HF) is used to remove pad oxide 14, and to further reduce the size and lateral extension of bird's beak 34.

Figure 2G:
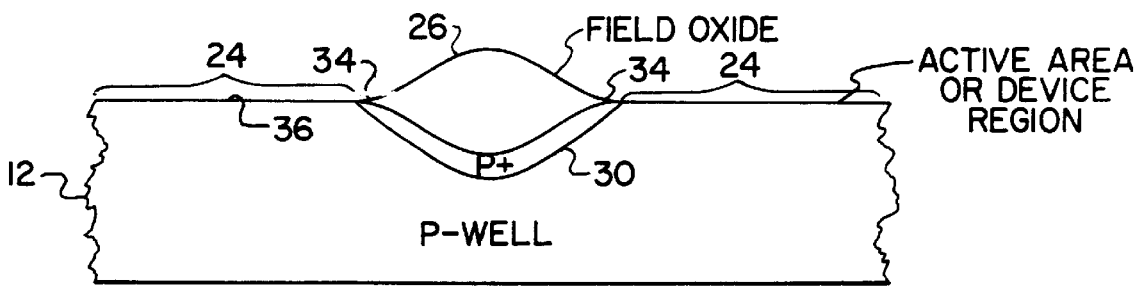
Figure 3:
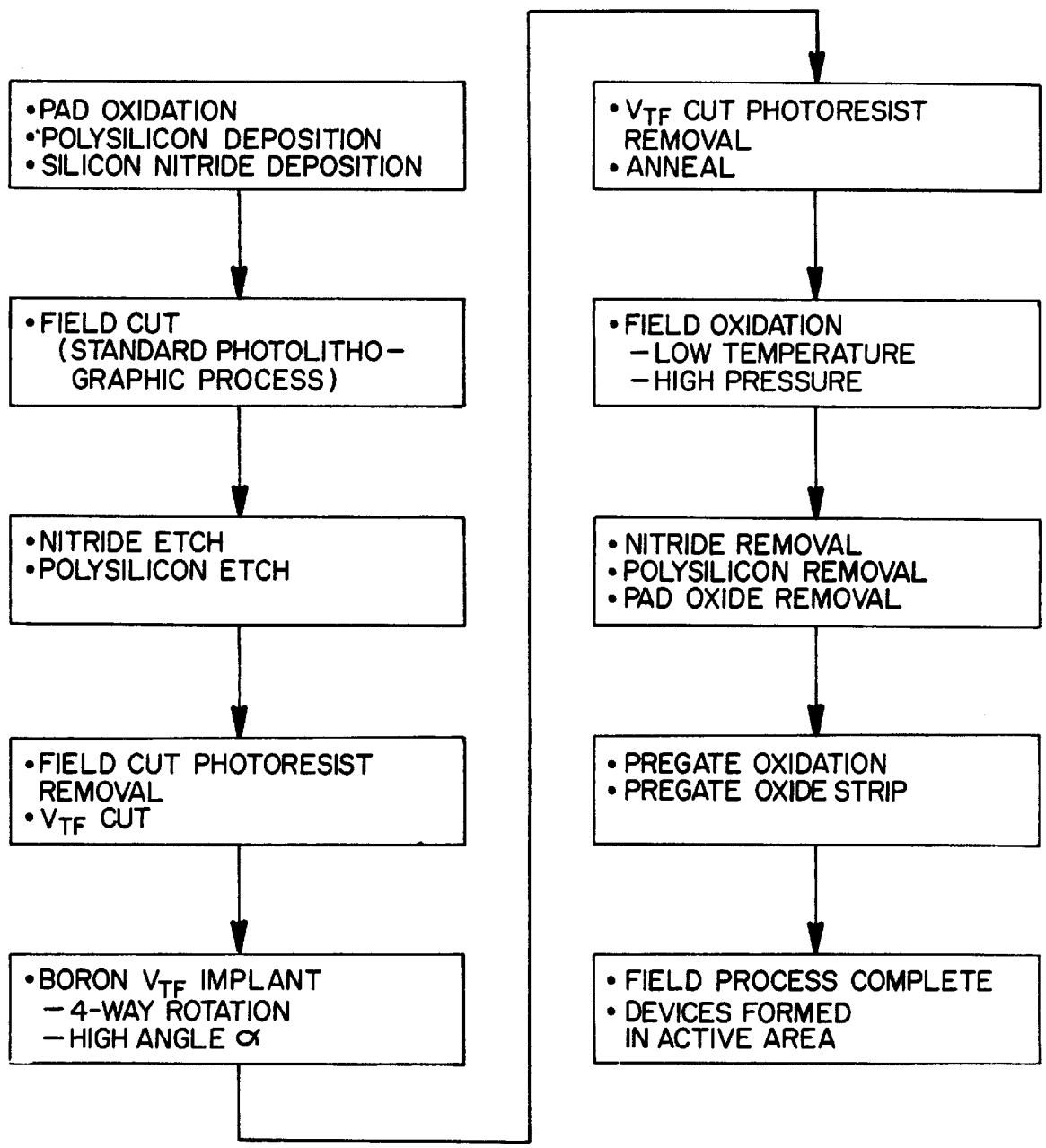
FIG. 3 is a flow diagram of the process of the invention.

FIG. 2g is the stage wherein a "pre-gate" oxidation is performed to remove defects in the silicon near the region of the high-stress field edge. Pre-gate oxide strip 36, subject to dilute hydroflouric acid, can be intentionally lengthened to further reduce the lateral extension of bird's beak 34 and to ensure that strip 38 is contained with P+ $V_{TF}$ region 30. At this point, the field oxide process is complete and devices can be formed in active area 24. Primary advantages of the invention are that field oxide is radiation hard and has smooth topography for allowing relatively simple submicron line patterning. Also, the process for the invention is briefer and simpler than the related art RICMOS processes.

What is claimed is:

1. A method for fabricating hardened isolation for devices in Metal oxide semiconductor circuitry, comprising:

depositing a pad oxide layer on a silicon substrate;

depositing a polysilicon layer on the pad oxide layer;

depositing a silicon nitride layer on the polysilicon layer;

cutting an opening in the silicon nitride layer and polysilicon layer to expose a portion of the pad oxide layer;

implanting a dopant into the opening at a high tilt angle in a rotating fashion to project the dopant into the silicon layer beneath polysilicon edges of the opening bordering the pad oxide layer;

annealing the opening in nitrogen at about 850 or more degrees Centigrade for about 20 or more minutes;

oxidizing the exposed portion of the pad oxide layer under high pressure thereby causing the silicon beneath the exposed pad oxide layer to grow into a field oxide having expansion encroaching like a bird's beak between the silicon substrate and the polysilicon and silicon nitride layers at the polysilicon edges;

removing the silicon nitride layers;

removing the polysilicon layer;

removing the remaining pad oxide layer; and reducing size and lateral extension of the field oxide.

2. Method of claim 1 further comprising performing a sacrificial oxidation to remove defects in the silicon substrate.

3. Method of claim 2 further comprising forming devices on the silicon substrate.

4. Method of claim 1 wherein:

the pad oxide layer has a thickness ranging from about 50 to 150 angstroms;

the polysilicon layer has a thickness ranging from about 400 to 600 angstroms; and the silicon nitride layer has a thickness ranging from about 2000 to 3000 angstroms.

5. Method of claim 4 wherein:

said cutting an opening is an anisotropic dry etch process;

the dopant is boron;

said oxidizing is wet $O_2$ oxidizing at about 800 to 900 degrees Centigrade under a pressure of about 5 to 10 atmospheres;

said removing the silicon nitride layer is performed with application of hot phosphoric acid;

said removing the polysilicon layer is performed with application of potassium hydroxide;

said removing the pad oxide layer is performed with application of dilute hydrofluoric acids; and said reducing side and extension of the field oxide is performed with application of dilute hydrofluoric acid.

6. A process of fabrication for a hardened reduced-bird's beak device isolation for metal oxide semiconductor circuitry, comprising:

providing a silicon substrate;

forming a silicon oxide layer over the substrate;

forming a polycrystalline silicon layer over the oxide layer;

forcing a silicon nitride layer over the polycrystalline silicon layer;

removing a first portion of the silicon nitride layer and of the polycrystalline silicon layer to expose at least one portion of the silicon oxide layer on the silicon substrate;

implanting a dopant into the at least one portion of the silicon oxide layer and into the silicon substrate;

oxidizing the at least one portion and the silicon substrate adjacent to the at least one portion;

removing the remaining second portion of silicon nitride layer and of the polycrystalline layer, exposing another portion of the silicon oxide layer covered by the second portion of the silicon polycrystalline layer; and removing the silicon oxide layer formerly covered by the second portion of the polycrystalline silicon layer.

7. Process of claim 6 wherein:

the silicon oxide layer has a thickness about 50 to 150 angstroms; and the polycrystalline silicon layer has a thickness about 400 to 600 angstroms.

8. Process of claim 7 wherein the silicon nitride layer has a thickness about 2000 to 3000 angstroms.

9. Process of claim 8 wherein:

said oxidizing the at least one portion utilizes oxygen under high pressure to increase growth rate of oxide and result in a radiation hardened reduced-bird's beak device isolation for the substrate.

10. A method for fabricating radiation insensitive device isolation for metal oxide semiconductor circuitry, comprising:

forming an oxide layer on a substrate;

depositing a polysilicon layer on the oxide layer;

depositing a silicon nitride layer on the polysilicon layer;

laying a layer of photoresist material, having a first pattern, on the silicon nitride layer, wherein said material covers a first portion of an area having the first portion and a second portion;

marking, via a photolithographic process, on the silicon nitride layer the first portion of area;

removing, via an etch process, the silicon nitride layer and the polysilicon layer of the second portion of the area;

removing the layer of photoresist material having the first pattern;

implanting a dopant, at an angle relative to a line perpendicular to the oxide layer and wherein the angle is rotated about the line as an axis, into the oxide layer and the substrate;

annealing to remove implant damage;

oxidizing the second portion of the area resulting in a growth of a field oxide;

removing the silicon nitride of the first portion of the area;

removing the polysilicon of the first portion of the area;

removing the pad oxide of the first portion of the area; and forming one or more semiconductor devices in the first portion of the area.

11. Method of claim 10 wherein:

said removing the silicon nitride layer and the polysilicon layer of the second portion of the area is performed by an anisotropic reactive ion etch;

said removing the layer of photoresist material having the first pattern is performed by an application of sulfuric peroxide solution;

said annealing is performed in nitrogen at about 850 or more degrees Centigrade for at least about 20 minutes;

said oxidizing the second portion of the area resulting in the growth of field oxide is performed with $O_2$ at about 800 to 900 degrees Centigrade under about 5 to 10 atmospheres of pressure;

the field oxide has a "bird's beak" that encroaches beneath the silicon nitride edge and the polysilicon edge;

said removing silicon nitride of the first portion of the area is performed with hot phosphoric acid;

said removing the polysilicon of the first portion of the area is performed with potassium hydroxide;

said removing the pad oxide of the first portion of the area is performed with dilute hydrofluoric acid; and said removing the pad oxide results in reduction of the size and lateral extension of the bird's beak of the field oxide.

12. Method of claim 11 wherein:

the pad oxide layer is about 50 to 150 angstroms thick;

the polysilicon layer is about 400 to 600 angstroms thick;

the silicon nitride layer is about 2000 to 3000 angstroms thick; and the dopant of said implanting is boron.

13. A device-isolating field oxide configuration comprising:

a P-well substrate;

a first plurality of areas of N+ material on said P-well substrate;

a P+ diffusion implanted in said P-well substrate in areas between the areas of N+ material of said first plurality; and a second plurality of field oxide layers on the areas between the areas of N+ material of said first plurality wherein each of said second plurality of field oxide layers is tapered to a thin layer near boundaries of the areas of N+ material in a shape of a diminished bird's beak resulting in a hardened reduced bird's beak device isolation for the areas of N+ material of said first plurality.

14. Apparatus of claim 13 further comprising a polysilicon strip set on said first plurality of areas of N+ material and on said second plurality of field oxide layers.

15. Apparatus of claim 14 further comprising a layer of oxide between said polysilicon strip and said first and second pluralities.

* * * * *